US00RE45035E

(19) United States
(12) Reissued Patent
Lin et al.

(10) Patent Number: US RE45,035 E
(45) Date of Reissued Patent: Jul. 22, 2014

(54) VERIFICATION CIRCUITS AND METHODS FOR PHASE CHANGE MEMORY ARRAY

(71) Applicant: Higgs Opl. Capital LLC, Dover, DE (US)

(72) Inventors: Wen-Pin Lin, Dacun Township (TW); Shyh-Shyuan Sheu, Taichung (TW); Pei-Chia Chiang, Taipei (TW)

(73) Assignee: Higgs Opl. Capital LLC, Dover, DE (US)

(21) Appl. No.: 13/934,954

(22) Filed: Jul. 3, 2013

Related U.S. Patent Documents

Reissue of:
(64) Patent No.: 7,974,122
Issued: Jul. 5, 2011
Appl. No.: 12/485,720
Filed: Jun. 16, 2009

(30) Foreign Application Priority Data

Dec. 30, 2008 (TW) ..... 097151378 A

(51) Int. Cl.
*G11C 11/00* (2006.01)
*G11C 13/00* (2006.01)

(52) U.S. Cl.
CPC ..... *G11C 13/0064* (2013.01); *G11C 13/0002* (2013.01); *G11C 13/0004* (2013.01)
USPC ..... 365/163; 365/148; 365/189.07

(58) Field of Classification Search
CPC ..... G11C 11/5678; G11C 13/0002; G11C 13/0004; G11C 13/0064
USPC ..... 365/163, 100, 113, 148, 185.2, 185.22, 365/189.07
See application file for complete search history.

(56) References Cited

U.S. PATENT DOCUMENTS 4,974,205 A 11/1990 Kotani
5,694,363 A 12/1997 Calligaro et al.

(Continued)

FOREIGN PATENT DOCUMENTS

CN 1455412 11/2003
CN 101136452 3/2008

(Continued)

OTHER PUBLICATIONS

J.H. Yi et al., "Novel Cell Structure of PRAM With Thin Metal Layer Inserted GeSbTe", IEEE, IEDM '03 Technical Digest; 2003; pp. 901-904.

(Continued)

*Primary Examiner* — Tan T. Nguyen
(74) *Attorney, Agent, or Firm* — Stolowitz Ford Cowger LLP

(57) ABSTRACT

A verification circuit for a phase change memory array is provided. A sensing unit senses a sensing voltage from a memory cell of the phase change memory array according to an enable signal. A comparator generates a comparing signal according to the sensing voltage and a reference voltage, so as to indicate whether the memory cell is in a reset state. A control unit generates a control signal according to the enable signal. An operating unit generates a first signal according to the control signal, so as to indicate whether the comparator is active. An adjustment unit provides a writing current to the cell, and increases the writing current according to the control signal until the comparing signal indicates that the memory cell is in a reset state.

29 Claims, 10 Drawing Sheets

(56) References Cited

U.S. PATENT DOCUMENTS

| | | | | |
|---|---|---|---|---|
| 5,787,042 | A | 7/1998 | Morgan | |
| 5,883,837 | A | 3/1999 | Calligaro et al. | |
| 6,487,113 | B1 | 11/2002 | Park et al. | |
| 7,054,213 | B2 | 5/2006 | Laurent | |
| 7,110,286 | B2 | 9/2006 | Choi et al. | |
| 7,154,774 | B2 | 12/2006 | Bedeschi et al. | |
| 7,190,607 | B2 | 3/2007 | Cho et al. | |
| 7,259,982 | B2 | 8/2007 | Johnson | |
| 7,324,371 | B2 | 1/2008 | Khouri et al. | |
| 7,359,231 | B2 | 4/2008 | Venkataraman | |
| 7,388,775 | B2 | 6/2008 | Bedeschi | |
| 7,423,897 | B2 | 9/2008 | Wicker | |
| 7,447,092 | B2 | 11/2008 | Cho et al. | |
| 7,457,151 | B2 | 11/2008 | Cho et al. | |
| 7,515,460 | B2 | 4/2009 | Gordon et al. | |
| 7,521,372 | B2 | 4/2009 | Chen | |
| 7,535,747 | B2 | 5/2009 | Lee et al. | |
| 7,542,356 | B2 | 6/2009 | Lee et al. | |
| 7,566,895 | B2 | 7/2009 | Chen | |
| 7,609,544 | B2 | 10/2009 | Osada et al. | |
| 7,639,522 | B2 * | 12/2009 | Cho et al. | 365/148 |
| 7,643,373 | B2 | 1/2010 | Sheu | |
| 7,646,627 | B2 | 1/2010 | Hidaka | |
| 7,670,869 | B2 | 3/2010 | Yu | |
| 7,672,176 | B2 | 3/2010 | Chiang | |
| 7,678,606 | B2 | 3/2010 | Chen | |
| 7,679,163 | B2 | 3/2010 | Chen | |
| 7,745,811 | B2 | 6/2010 | Lee | |
| 7,773,408 | B2 | 8/2010 | Takenaga et al. | |
| 7,773,409 | B2 | 8/2010 | Chen | |
| 7,773,410 | B2 | 8/2010 | Sheu et al. | |
| 7,773,411 | B2 | 8/2010 | Lin | |
| 7,787,281 | B2 | 8/2010 | Sheu | |
| 7,796,454 | B2 | 9/2010 | Lin et al. | |
| 7,796,455 | B2 | 9/2010 | Chiang | |
| 7,858,961 | B2 | 12/2010 | Chuang | |
| 7,885,109 | B2 | 2/2011 | Lin | |
| 7,889,547 | B2 | 2/2011 | Sheu | |
| 7,919,768 | B2 | 4/2011 | Chen | |
| 7,923,714 | B2 | 4/2011 | Hsu | |
| 7,933,147 | B2 | 4/2011 | Lin | |
| 7,964,862 | B2 | 6/2011 | Chen | |
| 7,974,122 | B2 | 7/2011 | Lin et al. | |
| 8,199,561 | B2 | 6/2012 | Sheu et al. | |
| 2005/0068804 | A1 | 3/2005 | Choi et al. | |
| 2006/0221678 | A1 | 10/2006 | Bedeschi et al. | |
| 2007/0002654 | A1 | 1/2007 | Borromeo et al. | |
| 2009/0189142 | A1 | 7/2009 | Chen | |
| 2009/0296458 | A1 | 12/2009 | Lee et al. | |
| 2010/0117050 | A1 | 5/2010 | Chen | |
| 2010/0165723 | A1 | 7/2010 | Sheu | |
| 2012/0230099 | A1 | 9/2012 | Sheu et al. | |

FOREIGN PATENT DOCUMENTS

| | | |
|---|---|---|
| CN | 101202326 | 6/2008 |
| CN | 101211959 | 7/2008 |
| CN | 101266834 | 9/2008 |
| CN | 101271862 | 9/2008 |
| CN | 101276643 | 10/2008 |
| CN | 101308903 | 11/2008 |
| CN | 101312230 | 11/2008 |
| CN | 101330126 | 12/2008 |
| CN | 101335045 | 12/2008 |
| CN | 101369450 | 2/2009 |
| CN | 101383397 | 3/2009 |
| CN | 101414480 | 4/2009 |
| CN | 101452743 | 6/2009 |
| CN | 101471130 | 7/2009 |
| CN | 101504863 | 8/2009 |
| CN | 101504968 | 8/2009 |
| CN | 101599301 | 12/2009 |
| CN | 101626060 | 1/2010 |
| CN | 101740716 | 6/2010 |
| CN | 101814323 | 8/2010 |
| CN | 101819816 | 9/2010 |
| JP | 2002246561 | 8/2002 |
| JP | 2004274055 | 9/2004 |
| JP | 2005525690 | 8/2005 |
| JP | 2006510220 | 3/2006 |
| JP | 2006108645 | 4/2006 |
| JP | 2006295168 | 10/2006 |
| JP | 2007103945 | 4/2007 |
| JP | 2007184591 | 7/2007 |
| JP | 2008171541 | 7/2008 |
| JP | 2008193071 | 8/2008 |
| JP | 2008226427 | 9/2008 |
| JP | 2008283163 | 11/2008 |
| TW | 200828506 | 7/2008 |
| TW | 200845443 | 11/2008 |
| TW | 200849278 | 12/2008 |
| TW | 200901196 | 1/2009 |
| TW | I305042 | 1/2009 |
| TW | 200908294 | 2/2009 |
| TW | 200913252 | 3/2009 |
| TW | 200915318 | 4/2009 |
| TW | 200921682 | 5/2009 |
| TW | I324823 | 5/2009 |
| TW | 200926186 | 6/2009 |
| TW | 200937693 | 9/2009 |
| TW | 200951981 | 12/2009 |
| TW | 200952169 | 12/2009 |
| TW | 201003851 | 1/2010 |
| TW | I320180 | 2/2010 |
| TW | 201019467 | 5/2010 |
| TW | 201025326 | 7/2010 |
| TW | 201025573 | 7/2010 |
| TW | I326917 | 7/2010 |
| TW | I328816 | 8/2010 |
| TW | I330846 | 9/2010 |
| TW | I334604 | 12/2010 |
| TW | I336925 | 2/2011 |
| TW | I342022 | 5/2011 |
| TW | I343642 | 6/2011 |
| TW | I318470 | 9/2011 |

OTHER PUBLICATIONS

Stolowitz Ford Cowger LLP, "Listing of Related Cases", Oct. 1, 2013, 1 page.

* cited by examiner

VERIFICATION CIRCUITS AND METHODS FOR PHASE CHANGE MEMORY ARRAY

Matter enclosed in heavy brackets [ ] appears in the original patent but forms no part of this reissue specification; matter printed in italics indicates the additions made by reissue.

CROSS REFERENCE TO RELATED APPLICATIONS

This Application *is a reissue of U.S. patent application Ser. No. 12/485,720, filed Jun. 16, 2009, now U.S. Pat. No. 7,974, 122, issued Jul. 5, 2011, which* claims priority of Taiwan Patent Application No. 097151378, filed on Dec. 30, 2008, the entirety of which [is] *are* incorporated by reference herein.

BACKGROUND

1. Technical Field

The present disclosure relates to a verification circuit, and more particularly to a verification circuit for a phase change memory array.

2. Description of the Related Art

A Phase Change Memory (PCM) is a non-volatile memory with high speed, high capacity and low energy consumption, wherein a plurality of PCM cells of the PCM cell is formed by phase change material, such as chalcogenide etc. The phase change material can be switched between two states, a crystalline state and an amorphous state, with the application of heat, wherein the phase change material has different resistances corresponding to the crystalline and amorphous states respectively, and the resistances respectively represent different stored data.

In general, different writing currents are provided to heat a PCM cell to change its resistance, such that data can be stored into the PCM cell. Furthermore, for a PCM cell, it is necessary for a writing current to transform the PCM cell into a reset state. Therefore, a verification circuit for verifying a PCM array is desired, which is used to verify that the memory cells of the PCM array have been transformed from a non-reset state to a reset state.

BRIEF SUMMARY

Verification circuits and verification methods for a phase change memory array are provided. An exemplary embodiment of such a verification circuit for a phase change memory array comprises: a sensing unit, sensing a first sensing voltage from a first memory cell of the phase change memory array according to an enable signal; a comparator, generating a comparing signal according to the first sensing voltage and a reference voltage, so as to indicate whether the first memory cell is in a reset state; a control unit, generating a control signal according to the enable signal; an operating unit, generating a first signal according to the control signal, so as to indicate whether the comparator is active; and an adjusting unit, providing a writing current to the first memory cell and adjusting the writing current according to the control signal until the comparing signal indicates that the first memory cell is in a reset state.

Furthermore, an exemplary embodiment of a verification method for a phase change memory array is provided. A memory cell of the phase change memory array is read to obtain a sensing voltage. The sensing voltage is compared with a reference voltage. When the sensing voltage is smaller than the reference voltage, a writing current is provided to the memory cell and the writing current is gradually increased until the sensing voltage corresponding to the writing current is larger than or equal to the reference voltage.

Moreover, another exemplary embodiment of a verification method for a phase change memory array is provided. A writing current is provided to a first memory cell of the phase change memory array and the writing current is gradually increased until a first sensing voltage sensed from the first memory cell is larger than or equal to a reference voltage. The current magnitude of the writing current is recorded as a reference current magnitude when the first sensing voltage is larger than or equal to a reference voltage. A second memory cell of the phase change memory array is read to obtain a second sensing voltage. It is determined whether the second memory cell is in a reset state by comparing the second sensing voltage and the reference voltage. The writing current with the reference current magnitude is provided to the second memory cell to transform the second memory cell into a reset state when the second memory cell is in a non-reset state. A detailed description is given in the following exemplary embodiments with reference to the accompanying drawings.

DETAILED DESCRIPTION

The following description is made for the purpose of illustrating the general principles of the disclosure and should not be taken in a limiting sense. The scope of the embodiments is best determined by reference to the appended claims and their equivalents.

Figure 1:
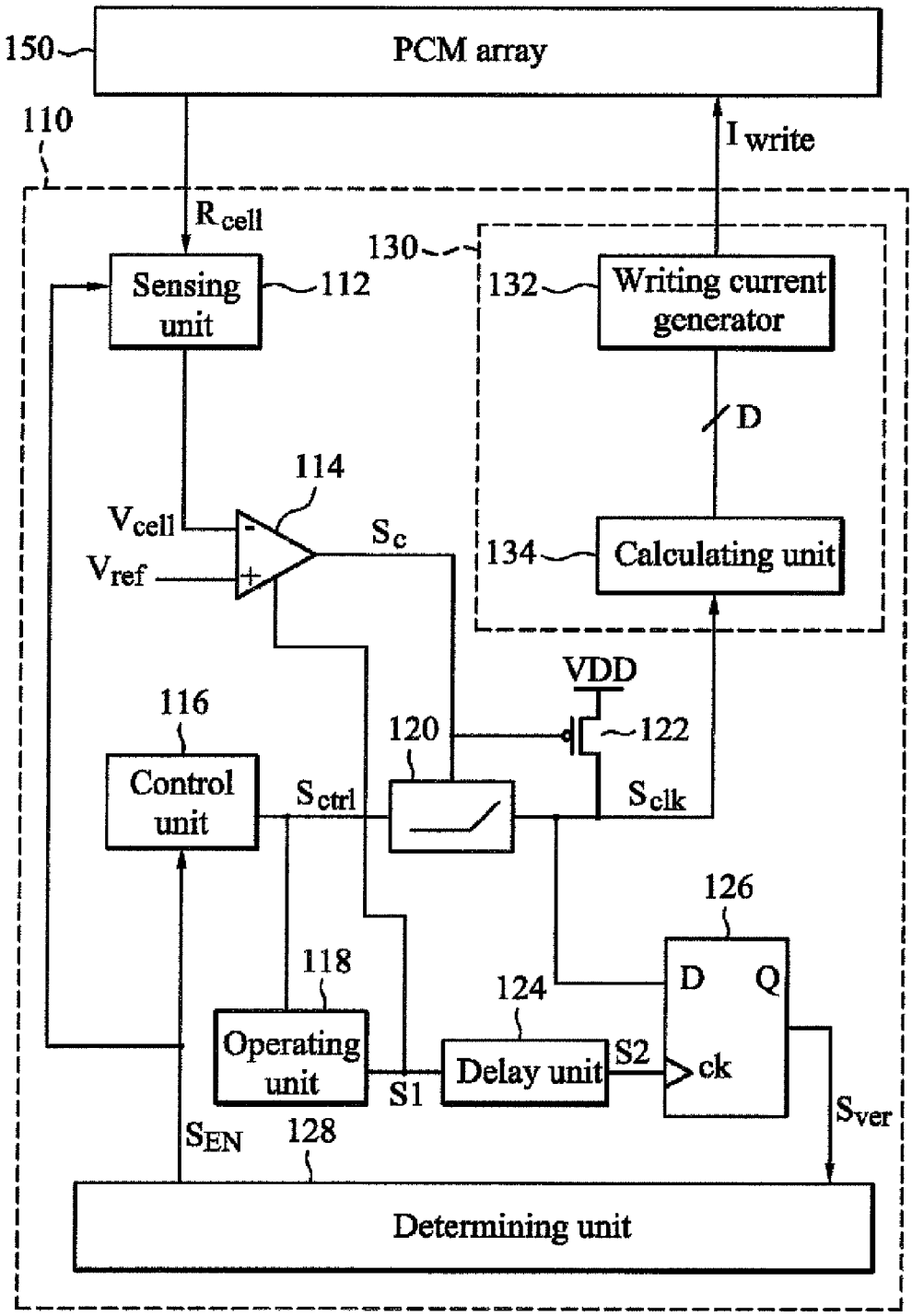
FIG. 1 shows a verification circuit according to an exemplary embodiment.

FIG. 1 shows a verification circuit 110 for verifying whether each memory cell of a phase change memory (PCM) army 150 is in a reset state according to an exemplary embodiment. The verification circuit 110 comprises a sensing unit 112, a comparator 114, a control unit 116, an operating unit 118, a delay unit 124, a flip-flop 126, a determining unit 128, an adjusting unit 130 and two switches 120 and 122. The operating unit 118 is coupled between the control unit 116 and the delay unit 124, and the operating unit 118 is used to receive a control signal $S_{ctrl}$ to generate a signal S1, so as to indicate that the comparator 114 is active or not. The delay unit 124 receives and delays the signal S1 to generate a signal S2 and then provides the signal S2 to a clock input terminal of the flip-flop 126. In addition, the flip-flop 126 further comprises a data input terminal coupled to the switch 120 and a data output terminal coupled to the determining unit 128.

When receiving an enable signal $S_{EN}$ provided by the determining unit 128, the sensing unit 112 may read a memory cell of the PCM array 150 to sense a resistance $R_{cell}$ of the memory cell, so as to obtain a sensing voltage $V_{cell}$ corresponding to the resistance $R_{cell}$. Next, the comparator 114 may compare the sensing voltage $V_{cell}$ with a reference voltage $V_{ref}$, so as to generate a comparing signal $S_c$ to indicate the state of the read memory cell. For example, the comparing signal $S_c$ indicates that the read memory cell is in a non-reset state when the sensing voltage $V_{cell}$ is smaller than the reference voltage $V_{ref}$, and the comparing signal $S_c$ indicates that the read memory cell has be transformed into a reset state when the sensing voltage $V_{cell}$ is larger than or equal to the reference voltage $V_{ref}$.

Figure 2:
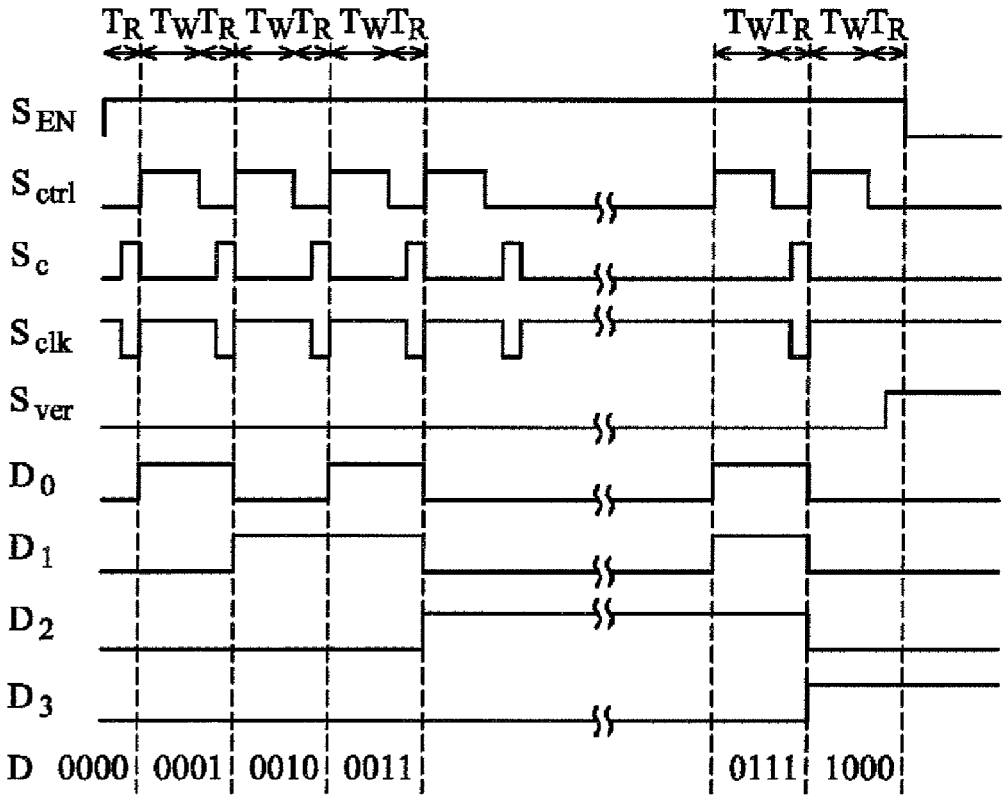
FIG. 2 shows a waveform diagram of the signals of the verification circuit shown in FIG. 1.

Furthermore, the determining unit 128 also provides the enable signal $S_{EN}$ to the control unit 116 to generate the control signal $S_{ctrl}$. Next, the operating unit 118 generates the signal S1 according to the control signal $S_{ctrl}$, so as to control the comparator 114 to operate or not. Next, the comparing signal $S_c$ may control the switches 120 and 122 to turn on or off. The switch 120 is coupled between the control unit 116 and the adjusting unit 130 and the switch 122 is coupled between a voltage VDD and the switch 120, wherein the switches 120 and 122 are controlled by the comparing signal $S_c$. Therefore, the comparing signal $S_c$ may control the switches 120 and 122 to change the control signal $S_{ctrl}$ into a signal $S_{clk}$ and provide the signal $S_{clk}$ to the adjusting unit 130 and the flip-flop 126. Referring to FIG. 1 and FIG. 2 together, FIG. 2 shows a waveform diagram of the signals of the verification circuit 110 shown in FIG. 1. The control signal $S_{ctrl}$ and the signal $S_{clk}$ are the pulse signals with identical frequencies but different duty cycles. In addition, the adjusting unit 130 comprises a writing current generator 132 and a calculating unit 134. The calculating unit 134 may count/calculate the pulse number of the signal $S_{clk}$ to generate an adjusting signal D comprising a plurality of bits. In the embodiment show in FIG. 2, the adjusting signal D comprises four bits $D_0$, $D_1$, $D_2$ and $D_3$. Next, the writing current generator 132 generates a writing current $I_{write}$ to the memory cell of the PCM array 150 according to the adjusting signal D, so as to transform the state of the memory cell. Furthermore, the writing current generator 132 may also adjust a current magnitude of the writing current $I_{write}$ according to the adjusting signal D, i.e. the writing current $I_{write}$ has the current magnitude corresponding to the adjusting signal D. In the present disclosure, the bit number of the adjusting signal D may determine accuracy of the current magnitude for the writing current $I_{write}$.

Referring to FIG. 2, in a reading period $T_R$, the control signal $S_{ctrl}$ is at a low voltage level, Simultaneously, the sensing unit 112 may sense the sensing voltage $V_{cell}$ from the memory cell, i.e. the memory cell is read by the verification circuit 110. In a writing period $T_W$, the adjusting unit 130 may provide the writing current $I_{write}$ having the current magnitude corresponding to the adjusting signal D to the memory cell, so as to change the resistance of the memory cell. For example, for the duration that the data value of the adjusting signal D is "0010", the verification circuit 110 may provide the writing current $I_{write}$ with the current magnitude corresponding to "0010" to the memory cell in a writing period $T_W$. Next, in a reading period $T_R$, the verification circuit 110 may sense and determine whether the memory cell is in a reset state. If not, the verification circuit 110 may provide the writing current $I_{write}$ with the current magnitude corresponding to "0011" to the memory cell in a next writing period $T_W$. Therefore, the verification circuit 110 may gradually increase the writing current $I_{write}$ until the memory cell is transformed from a non-reset state to a reset state. For example, for the duration that the data value of the adjusting signal D is "1000", the verification circuit 110 may provide the writing current $I_{write}$ with the current magnitude corresponding to "1000" to the memory cell in a writing period $T_W$. Next, the verification circuit 110 may read the memory cell to obtain the sensing voltage $V_{cell}$ corresponding to the current magnitude "1000" in a reading period $T_R$. The comparing signal $S_c$ may indicate that the read memory cell has been transformed into a reset state when the sensing voltage $V_{cell}$ corresponding to the current magnitude "1000" is larger than or equal to the reference voltage $V_{ref}$. Next, the flip-flop 126 may provide a verification signal $S_{ver}$ to the determining unit 128, so as to provide a next enable signal $S_{EN}$ to the sensing unit 112 for verifying another memory cell.

Figure 3A:
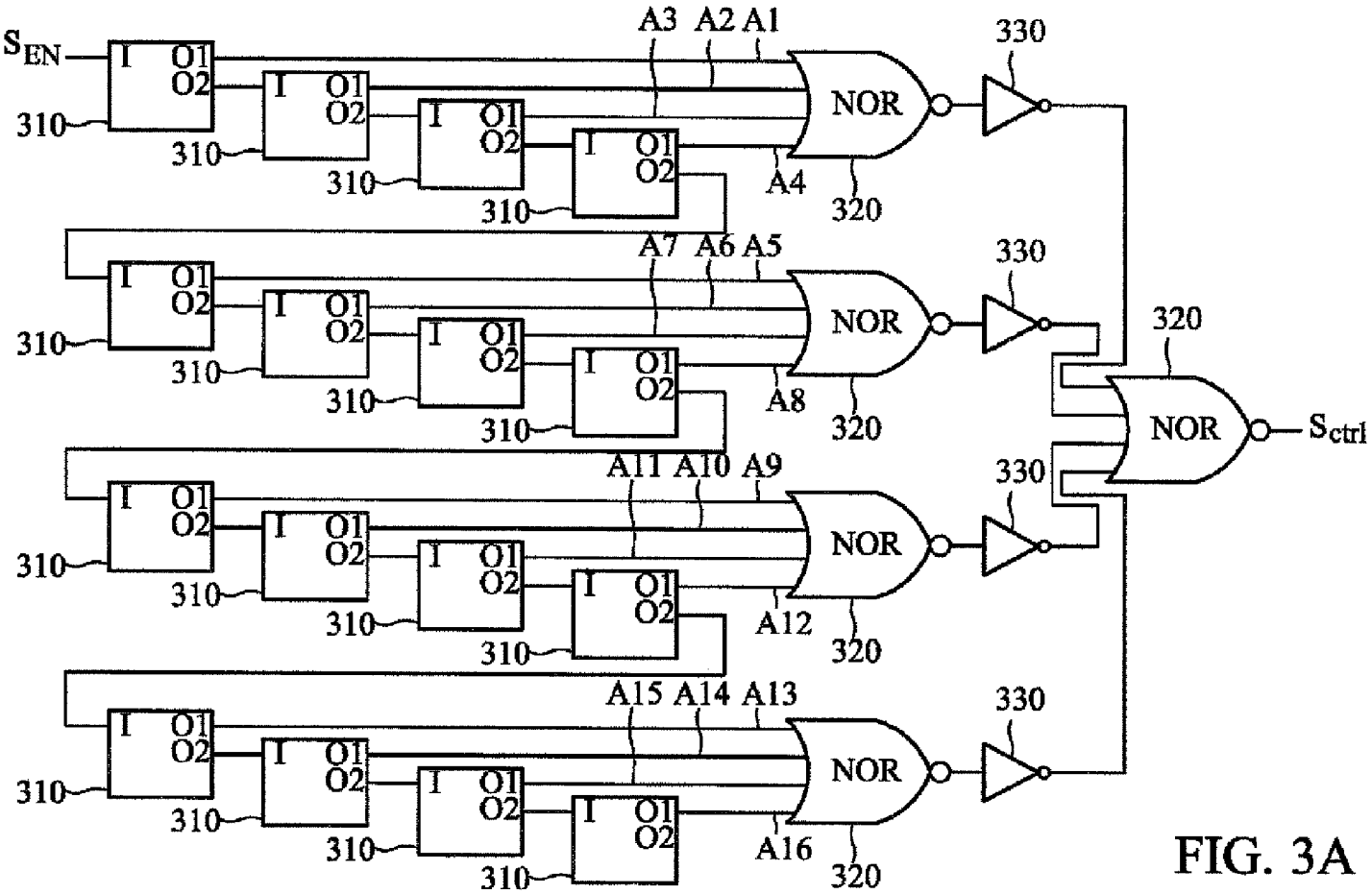
FIG. 3A shows a schematic diagram of a control unit according to an exemplary embodiment.
Figure 3B:
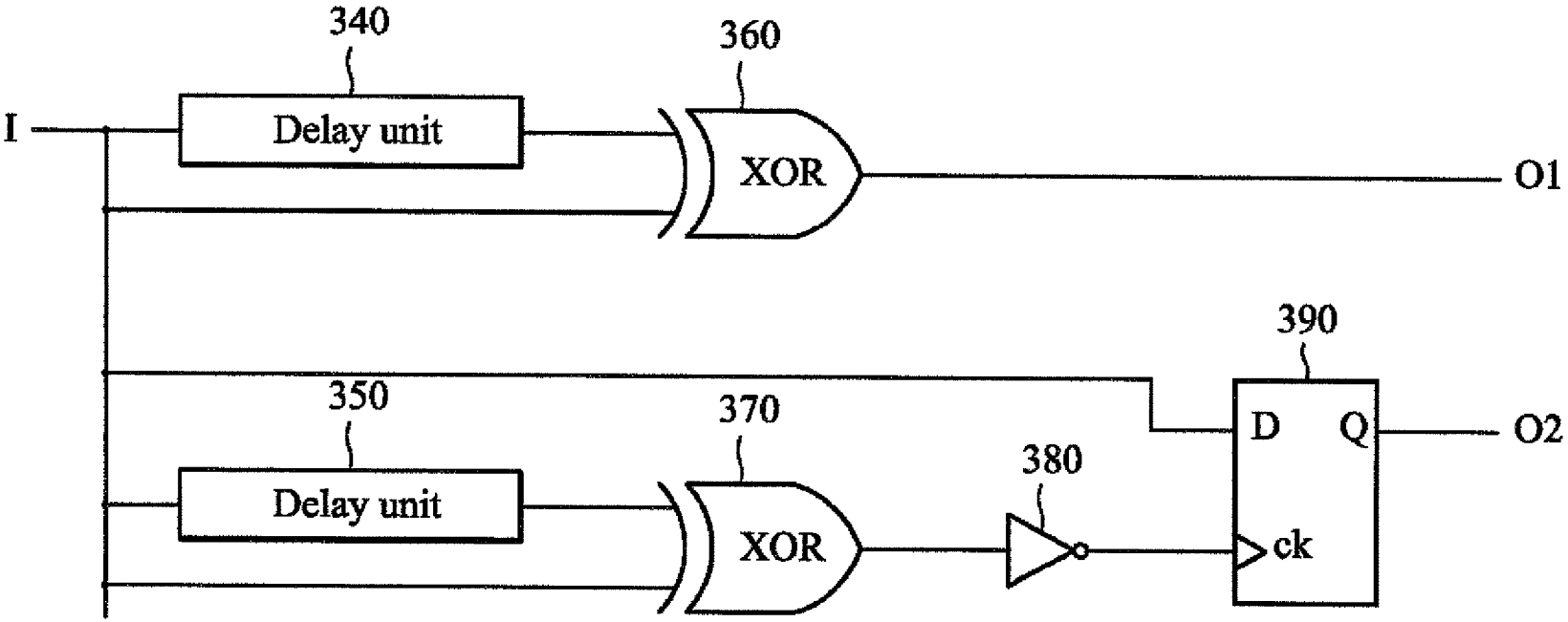
FIG. 3B shows a schematic diagram of a detecting unit according to an exemplary embodiment.
Figure 3C:
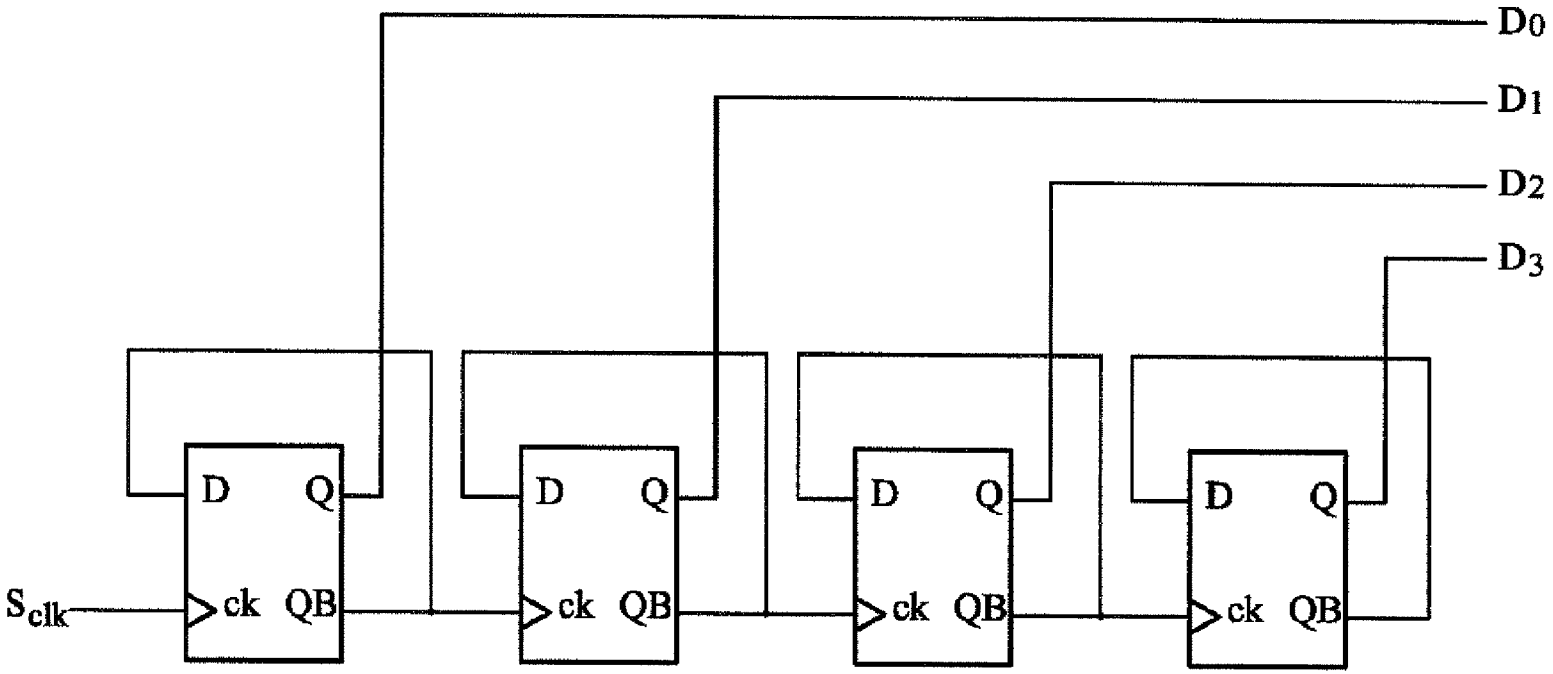
FIG. 3C shows a schematic diagram of a calculating unit according to an exemplary embodiment.

FIG. 3A shows a schematic diagram of a control unit according to an exemplary embodiment. Corresponding to an adjusting signal D with four bits, the control unit comprises sixteen detecting units 310, five NOR gates 320 and four inverters 330. FIG. 3B shows a schematic diagram of a detecting unit according to an exemplary embodiment. The detecting unit comprises two delay units 340 and 350, two XOR gates 360 and 370, an inverter 380 and a flip-flop 390. In a verification circuit, a period time of a writing period $T_W$ is determined by the delay unit 340, and an entire period time of a writing period $T_W$ and a reading period $T_R$ is determined by the delay unit 350. FIG. 3C shows a schematic diagram of a calculating unit according to an exemplary embodiment. In one embodiment, the calculating unit is an accumulator comprising four flip-flops.

Figure 4:
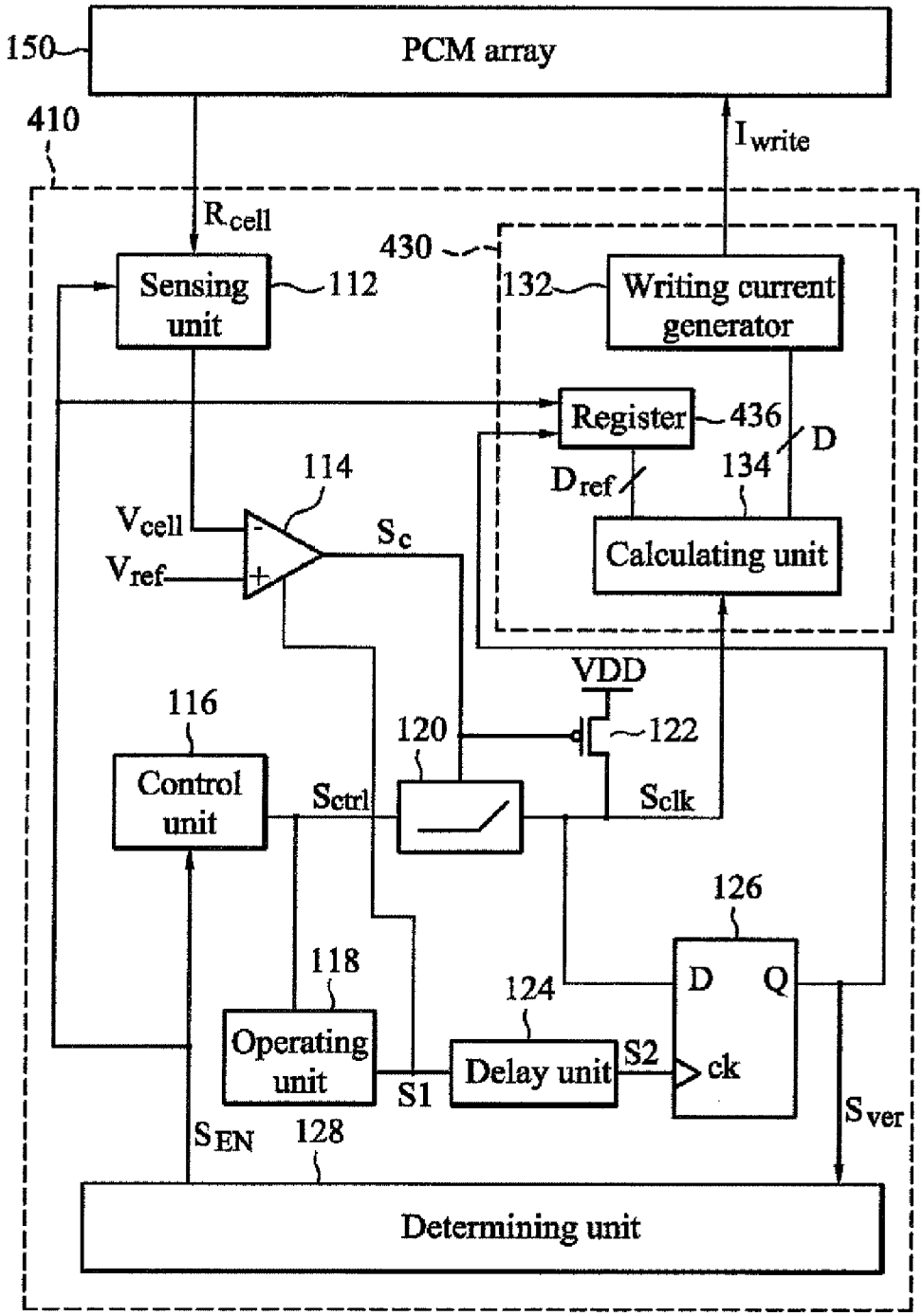
FIG. 4 shows a verification circuit according to another exemplary embodiment.

FIG. 4 shows a verification circuit 410 according to another exemplary embodiment. Compared with the adjusting unit 130 of the verification circuit 110 in FIG. 1, an adjusting unit 430 further comprises a register 436. As described above, when the comparing signal $S_c$ indicates that the read memory cell has been transformed into a reset state, the flip-flop 126 may generate the verification signal $S_{ver}$ to the determining unit 128 to verify another memory cell. Simultaneously, the flip-flop 126 may also provide the verification signal $S_{ver}$ to the register 436, so as to store an adjusting signal D corresponding to the present current magnitude of the writing current $I_{write}$ as a reference adjusting signal $D_{ref}$. Next, the determining unit 128 may provide a next enable signal $S_{EN}$ to the register 436, so as to provide the reference adjusting signal $D_{ref}$ stored in the register 436 to the calculating unit 134. Next, the calculating unit 134 may set the data value of the adjusting signal D according to the data value of the reference adjusting signal $D_{ref}$ such that the writing current generator 132 may provide a writing current $I_{write}$ corresponding to the reference adjusting signal $D_{ref}$ to the another memory cell to be verified.

Figure 5A:
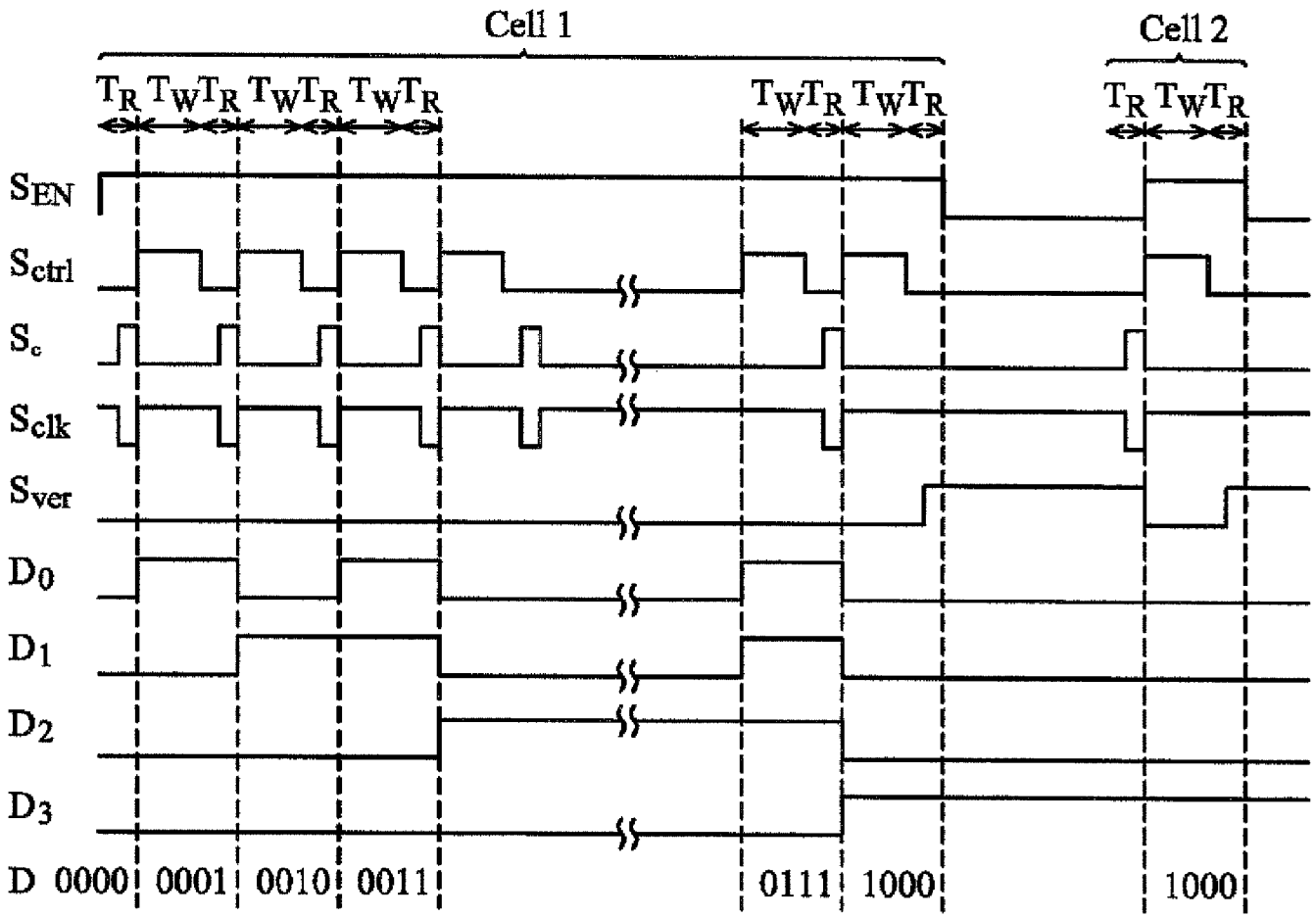
FIGS. 5A and 5B show a waveform diagram illustrating the verification circuit of FIG. 4 performing a verification procedure for different memory cells, respectively.
Figure 5B:
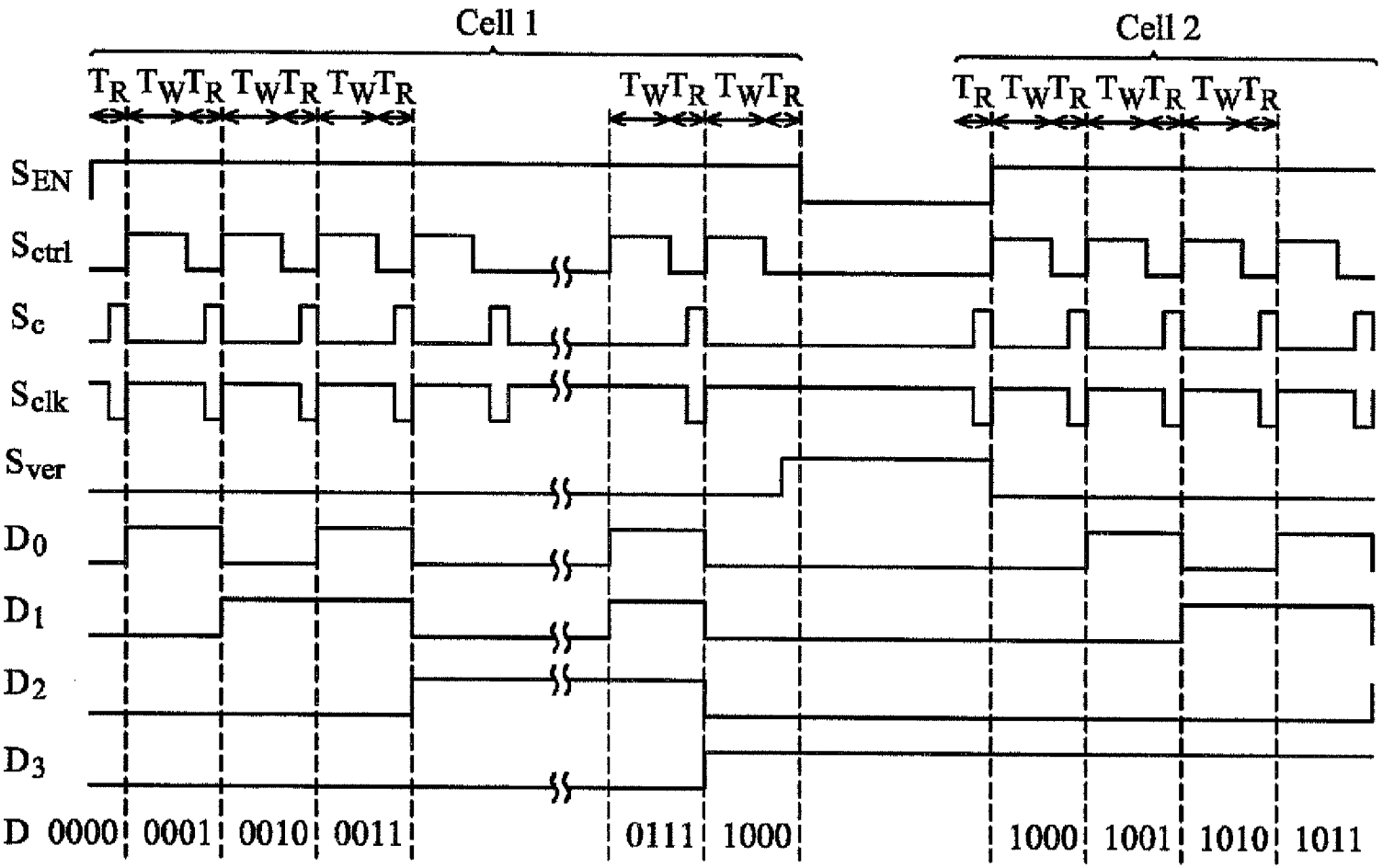

FIGS. 5A and 5B show a waveform diagram illustrating the verification circuit 410 of FIG. 4 performing a verification procedure for different memory cells, respectively. Referring to FIG. 4 and FIG. 5A together, first, the verification circuit 410 starts to verify a memory cell Cell 1 of the PCM array 150. As described above, for the duration that the data value of the adjusting signal D is "1000", the verification circuit 410 senses that the memory cell Cell 1 has been transformed into a reset state. Next, the register 436 may store "1000" as the data value of the reference adjusting signal $D_{ref}$ according to the verification signal $S_{ver}$. Next, the verification circuit 410 starts to verify another memory cell Cell 2 of the PCM array 150. The register 436 may provide the reference adjusting signal $D_{ref}$ to the calculating unit 134 as an initial value of the adjusting signal D according to an enable signal $S_{EN}$ corresponding to the memory cell Cell 2. For the memory cell Cell 2, first, the verification circuit 410 may read the memory cell Cell 2. Next, when sensing that the memory cell Cell 2 is in a non-reset state, the verification circuit 410 may provide a writing current $I_{write}$ corresponding to the reference adjusting signal $D_{ref}$, i.e. the calculating unit 134 may provide the adjusting signal D which has data value "1000" to the writing current generator 132, so as to generate the writing current $I_{write}$. Next, in a reading period $T_R$, the verification circuit 410 may read the memory cell 2 to obtain a sensing voltage $V_{cell}$ corresponding to "1000". The comparing signal $S_c$ indicates that the memory cell Cell 2 has been transformed into a reset state when the sensing voltage $V_{cell}$ is larger than or equal to the reference voltage $V_{ref}$. Next, the flip-flop 126 generates the verification signal $S_{ver}$ to the determining unit 128 to notify that the memory cell Cell 2 has been completely verified. Next, a next memory cell is verified until each memory cell of the PCM array has been completely verified. Accordingly, a verification time of a PCM memory array is decreased.

Referring to FIG. 4 and FIG. 5B together, after the memory cell Cell 1 has been verified, the data value "1000" of the adjusting signal D is stored into the register 436 as the data value of the reference adjusting signal $D_{ref}$. Next, when sensing that the memory cell Cell2 is in a non-reset state, the verification circuit 410 may provide the writing current $I_{write}$ with a current magnitude corresponding to the reference adjusting signal $D_{ref}$ to the memory cell Cell 2. Next, in a reading period $T_R$, the verification circuit 410 may read the memory cell 2 to obtain a sensing voltage $V_{cell}$ corresponding to "1000". When the sensing voltage $V_{cell}$ is smaller than the reference voltage $V_{ref}$ (i.e. the memory cell Cell 2 is in a non-reset state), the verification circuit 410 may gradually increase the writing current $I_{write}$ according to the adjusting signal D until the memory cell Cell 2 is transformed into a reset state, as shown in FIG. 5B. In one embodiment, the calculating unit 134 may use the data value "1000" of the reference adjusting signal $D_{ref}$ as the initial value of the adjusting signal D, and increase the data value of the adjusting signal D according to the pulse number of the signal $S_{clk}$.

Figure 6:
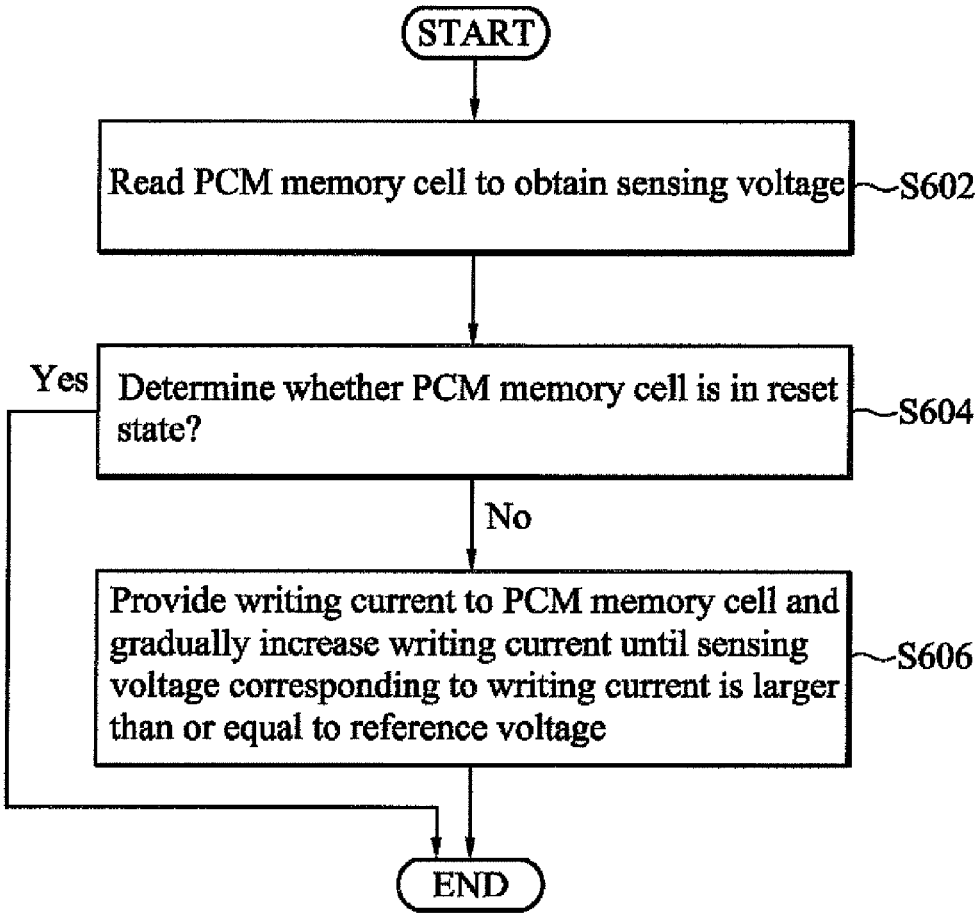
FIG. 6 shows a verification method for a PCM array according to an exemplary embodiment.

FIG. 6 shows a verification method for a PCM array according to an exemplary embodiment. First, in step S602, a memory cell of the PCM array is read to obtain a sensing voltage. Next, it is determined whether the memory cell has been transformed into a reset state by comparing the sensing voltage with a reference voltage (step S604). Next, in step S606, a writing current is provided to the memory cell when the sensing voltage is smaller than the reference voltage (i.e. the memory cell is in a non-reset state), and the writing current is gradually increased until the sensing voltage corresponding to the writing current is larger than or equal to the reference voltage, i.e. the memory cell is in a reset state, thus the memory cell is completely verified.

Figure 7:
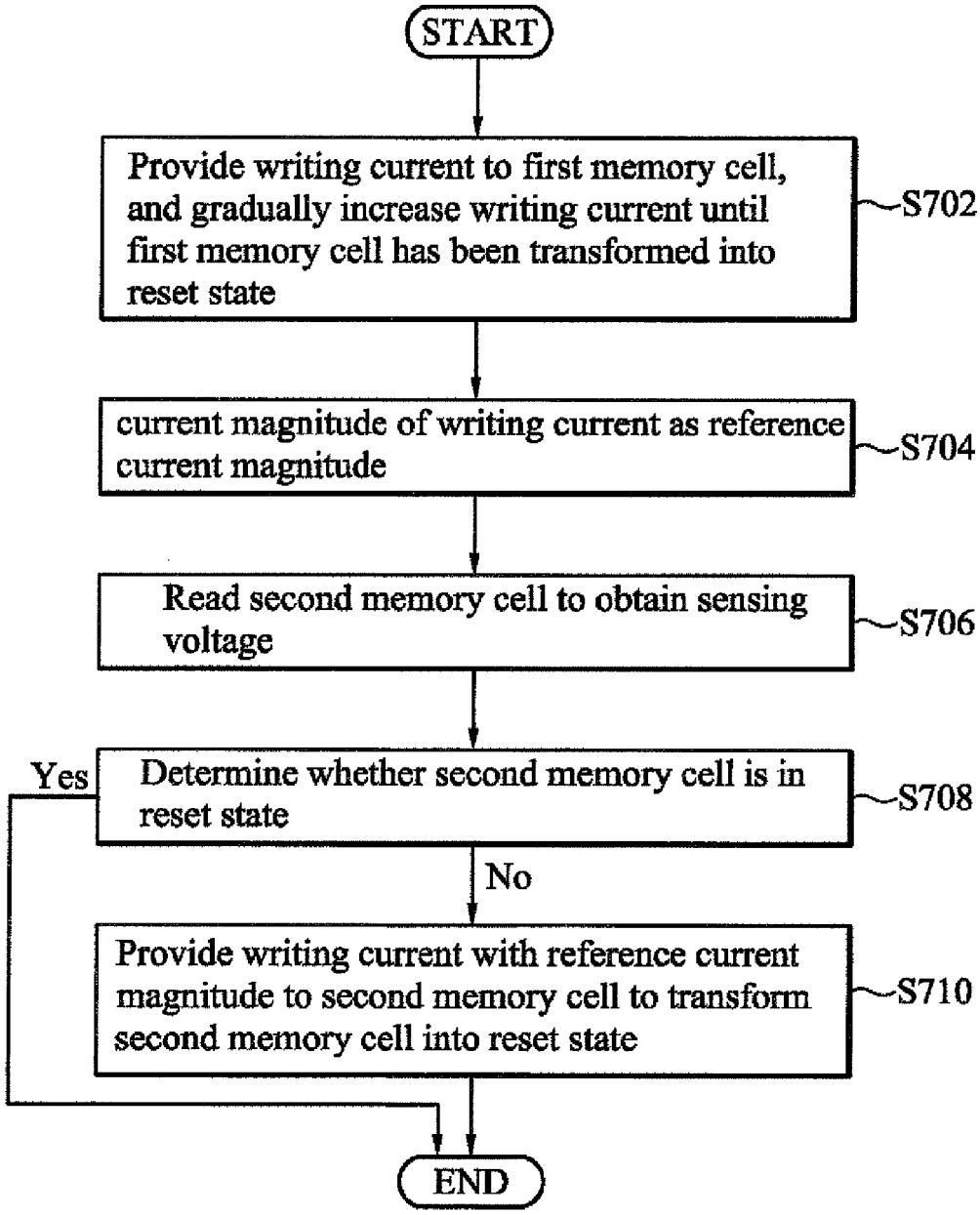
FIG. 7 shows a verification method for a PCM array according to another exemplary embodiment.

FIG. 7 shows a verification method for a PCM array according to another exemplary embodiment. First, in step S702, a writing current is provided to a first memory cell of the PCM array, and the writing current is gradually increased until a sensing voltage sensed from the first memory cell is larger than or equal to a reference voltage, i.e. the first memory cell has been transformed into a reset state. Next, a current magnitude of the writing current is recorded and stored as a reference current magnitude when the first memory cell has been transformed into a reset state (step S704). Next, a second memory cell of the PCM array is read to obtain a second sensing voltage (step S706). Next, it is determined whether the second memory cell is in a reset state by comparing the second sensing voltage with a reference voltage (step S708). A writing current with the reference current magnitude is provided to the second memory cell when the second memory cell is in a non-reset state, so as to transform the second memory cell from a non-reset state to a reset state (step S710). The second memory cell is in a non-reset state when the second sensing voltage corresponding to the writing current is smaller than the reference voltage. Therefore, the writing current is gradually increased until the second sensing voltage corresponding to the writing current is larger than or equal to the reference voltage, such that the second memory cell is transformed into a reset state.

While the disclosure has been described by way of example and in terms of embodiments, it is to be understood that the disclosure is not limited thereto. It will be apparent to those skilled in the art that various modifications and variations can be made in the disclosure. It is intended that the embodiments described be considered as exemplary only, with the true scope of the embodiments being indicated by the following claims and their equivalents.

What is claimed is:

1. A verification circuit for a phase change memory array, comprising:

a sensing unit, sensing a first sensing voltage from a first memory cell of the phase change memory array according to an enable signal;

a comparator, generating a comparing signal according to the first sensing voltage and a reference voltage to indicate whether the first memory cell is in a reset state;

a control unit, generating a control signal according to the enable signal; an operating unit, generating a first signal according to the control signal to indicate whether the comparator is active; and an adjusting unit, providing a writing current to the first memory cell and adjusting the writing current according to the control signal until the comparing signal indicates that the first memory cell is in a reset state.

2. The verification circuit as claimed in claim 1, wherein the comparing signal indicates that the first memory cell is in a non-reset state when the first sensing voltage is smaller than the reference voltage, and the comparing signal indicates that the first memory cell is in a reset state when the first sensing voltage is larger than or equal to the reference voltage.

3. The verification circuit as claimed in claim 2, wherein when the comparing signal indicates that the first memory cell is in a non-reset state, the adjusting unit gradually increases the writing current according to the control signal.

4. The verification circuit as claimed in claim 1, wherein the control signal is a pulse signal, and wherein the sensing unit senses the first sensing voltage from the first memory cell when the control signal is at a first voltage level, and the adjusting unit provides the writing current to the first memory cell when the control signal is at a second voltage level.

5. The verification circuit as claimed in claim 4, further comprising:

a first switch, having a first terminal coupled to the control unit and a second terminal coupled to the adjusting unit, wherein the first switch is controlled to transmit the control signal of the control unit to the adjusting unit according to the comparing signal; and a second switch coupled between a specific voltage and the second terminal, having a control terminal for receiving the comparing signal.

6. The verification circuit as claimed in claim 5, further comprising:

a delay unit, delaying the first signal to generate a second signal;

a flip-flop, having a data input terminal coupled to the second terminal, a clock input terminal for receiving the second signal, and a data output terminal for providing a verification signal; and a determining unit, providing the enable signal to the control unit.

7. The verification circuit as claimed in claim 6, wherein the adjusting unit further comprises:

a calculating unit, calculating the pulse number of the control signal to generate an adjusting signal with a plurality of bits; and a writing current generator, generating the writing current which has a current magnitude corresponding to the adjusting signal, and wherein the current magnitude of the writing current is of reference current magnitude when the comparing signal indicates that the first memory cell is in a reset state.

8. The verification circuit as claimed in claim 7, wherein the adjusting unit further comprises:

a register, storing the reference current magnitude.

9. The verification circuit as claimed in claim 6, wherein when the comparing signal indicates that the first memory cell is in a reset state, the determining unit provides the enable signal to the sensing unit according to the verification signal such that the sensing unit senses a second sensing voltage from a second memory cell of the phase change memory array according to the enable signal.

10. The verification circuit as claimed in claim 9, wherein when the comparing signal indicates that the first memory cell is in a reset state, the determining unit provides the enable signal to the control unit according to the verification signal such that the control unit generates the control signal according to the enable signal.

11. The verification circuit as claimed in claim 10, wherein the adjusting unit provides the writing current with the reference current magnitude to the second memory cell according to the control signal.

12. The verification circuit as claimed in claim 11, wherein the comparator generates the comparing signal according to the reference voltage and the second sensing voltage corresponding to the reference current magnitude, so as to indicate whether the second memory cell is in a reset state.

13. The verification circuit as claimed in claim 12, wherein the comparing signal indicates that the second memory cell is in a reset state when the second sensing voltage is larger than or equal to the reference voltage, and wherein the comparing signal indicates that the second memory cell is in a non-reset state when the second sensing voltage is smaller than the reference voltage.

14. The verification circuit as claimed in claim 13, wherein when the comparing signal indicates that the second memory cell is in a non-reset state, the adjusting unit gradually increases the writing current provided to the second memory cell according to the control signal such that the current magnitude of the writing current is larger than the reference current magnitude.

15. A verification method for a phase change memory array, comprising:

providing a writing current to a first memory cell of the phase change memory array and gradually increasing the writing current until a first sensing voltage sensed from the first memory cell is larger than or equal to a reference voltage;

recording the current magnitude of the writing current as a reference current magnitude when the first sensing voltage is larger than or equal to a reference voltage;

reading a second memory cell of the phase change memory array to obtain a second sensing voltage;

determining whether the second memory cell is in a reset state by comparing the second sensing voltage and the reference voltage; and providing the writing current with the reference current magnitude to the second memory cell to transform the second memory cell into a reset state when the second memory cell is in a non-reset state.

16. The verification method as claimed in claim 15, further comprising:

when the second sensing voltage corresponding to the reference current magnitude is smaller than the reference voltage, gradually increasing the writing current until the second sensing voltage corresponding to the writing current is larger than or equal to the reference voltage.

17. The verification method as claimed in claim 16, wherein the second memory cell is in a reset state when the second sensing voltage corresponding to the writing current is larger than or equal to the reference voltage, and wherein the second memory cell is in a non-reset state when the second sensing voltage corresponding to the writing current is smaller than the reference voltage.

*18. A method, comprising:*

*increasing a writing current applied to a first memory cell of a non-volatile memory until a first sensing voltage is larger than or equal to a reference voltage;*

*identifying a magnitude of the writing current as a reference current magnitude;*

*determining that a second memory cell of the non-volatile memory is in a non-reset state by comparing a second sensing voltage and the reference voltage; and*

*providing the writing current with the reference current magnitude to the second memory cell in response to said determining.*

*19. The method of claim 18, wherein the non-volatile memory comprises a memory which has different resistances corresponding to at least two switchable states of the non-volatile memory.*

*20. The method of claim 19, wherein the two switchable states comprise a crystalline state and an amorphous state indicative of stored data in the non-volatile memory.*

*21. The method of claim 18, wherein the non-volatile memory comprises a phase change memory.*

*22. The method of claim 18, further comprising determining that the first memory cell is in a reset state if the first sensing voltage is larger than or equal to the reference voltage, wherein said identifying comprises identifying the magnitude of the writing current in response to determining that the first memory cell is in the reset state.*

*23. The method of claim 18, further comprising transforming the second memory cell into a reset state in response to providing the writing current with the reference current magnitude.*

*24. A circuit, comprising:*

*a sensing unit configured to identify a sensing voltage associated with a first memory cell of a non-volatile memory;*

*a writing current generator configured to increase a writing current applied to the first memory cell until the first sensing voltage is larger than or equal to a reference voltage, wherein a magnitude of the writing current is configured to be identified as a reference current magnitude; and*

*a comparator configured to compare a second sensing voltage and the reference voltage, wherein the writing current with the reference current magnitude is applied*

*to a second memory cell of the non-volatile memory in response to determining that the second memory cell is in a non-reset state.*

*25. The circuit of claim 24, wherein the non-volatile memory comprises a memory device which changes resistance according to a switched state of the non-volatile memory.*

*26. The circuit of claim 25, wherein the switched state comprises a crystalline state or an amorphous state indicative of stored data in the non-volatile memory.*

*27. The circuit of claim 24, wherein the non-volatile memory comprises a phase change memory.*

*28. The circuit of claim 24, wherein the comparator is further configured to determine that the first memory cell is in a reset state if the first sensing voltage is larger than or equal to the reference voltage, and wherein the magnitude of the writing current is configured to be identified in response to determining that the first memory cell is in the reset state.*

*29. The circuit of claim 24, wherein the second memory cell is configured to be transformed into a reset state in response to applying the writing current with the reference current magnitude.*

* * * * *